US005625699A

United States Patent [19]

Yamada

[11] Patent Number: 5,625,699

[45] Date of Patent: Apr. 29, 1997

[54] SPEAKER DEVICE

[75] Inventor: Teruho Yamada, Hyogo, Japan

[73] Assignee: Mitsubishi Denki Kabushiki Kaisha, Hyogo, Japan

[21] Appl. No.: 174,021

[22] Filed: Dec. 28, 1993

[30] Foreign Application Priority Data

Aug. 5, 1993 [JP] Japan .................................... 5-194998

[51] Int. Cl.[6] ...................................................... H03G 5/00

[52] U.S. Cl. ............................ 381/99; 381/199; 381/201

[58] Field of Search ............................. 381/99, 199, 201, 381/194, 86

[56] References Cited

U.S. PATENT DOCUMENTS 2,857,478 9/1958 Harris ...................................... 179/116
4,284,857 8/1981 Slavin et al. ............................ 381/193

FOREIGN PATENT DOCUMENTS 60-4089 1/1985 Japan .............................. H04R 1/06
60-217792 10/1985 Japan .............................. H04R 1/06
4255197A 9/1992 Japan ...................................... 381/199
6178390A 6/1994 Japan ...................................... 381/199
6245294A 9/1994 Japan ...................................... 381/199

*Primary Examiner*—Edward L. Coles, Sr.
*Assistant Examiner*—Jerome Grant, II

[57] ABSTRACT

In a speaker device equipped with a crossover network according to the present invention, which is used mainly in an automobile sound reproducing system or the like, a capacitor for the crossover network is accommodated within a pole piece of the speaker unit itself to eliminate bulkiness based on an external form of the network unit, thereby permitting the speaker device to be installed in a short time during manufacture of a vehicle or the like.

6 Claims, 7 Drawing Sheets

FIG. 1 (PRIOR ART)
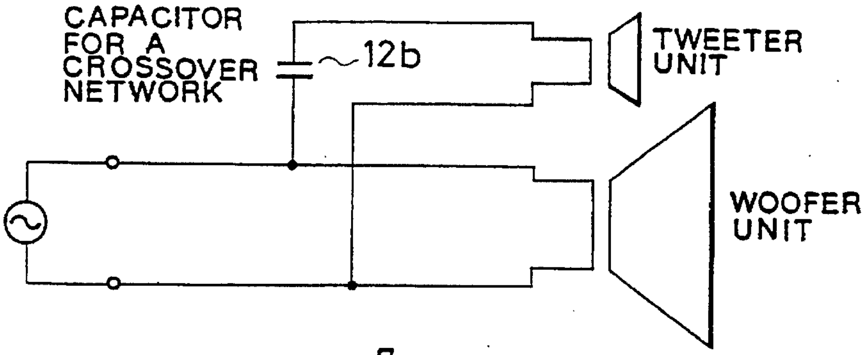
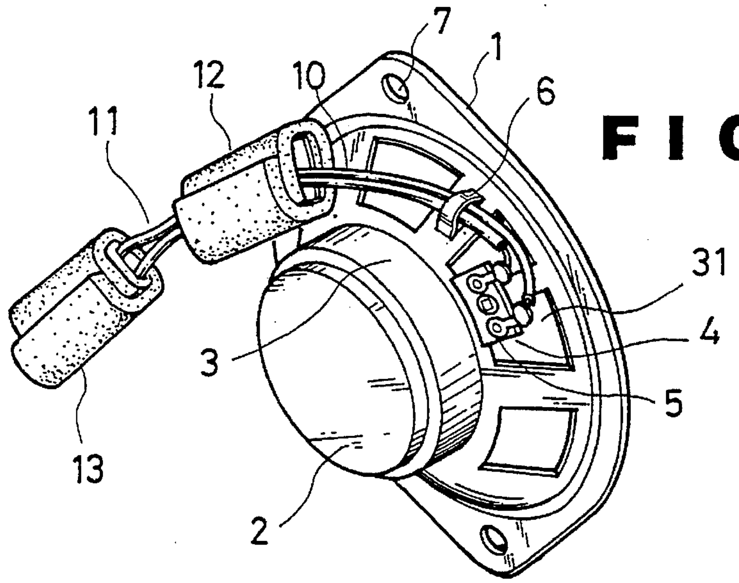
FIG. 2 (PRIOR ART)
FIG. 3
(PRIOR ART)
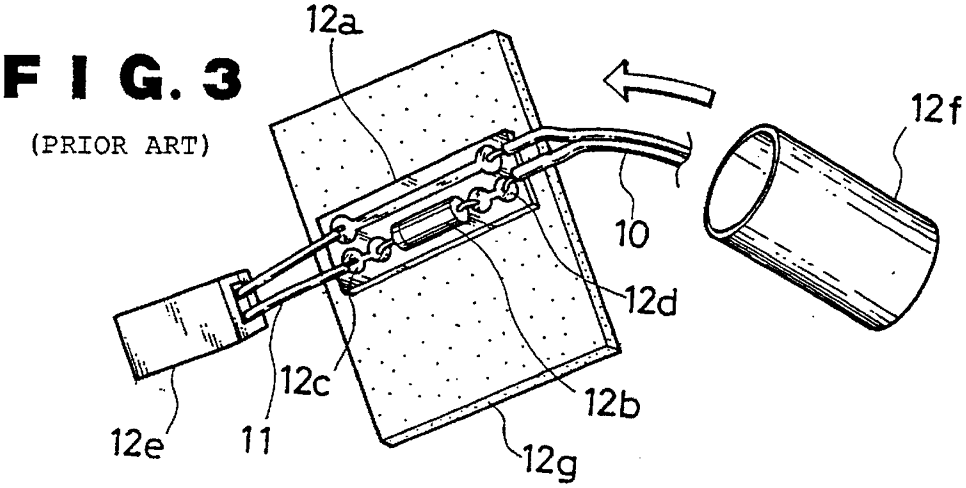

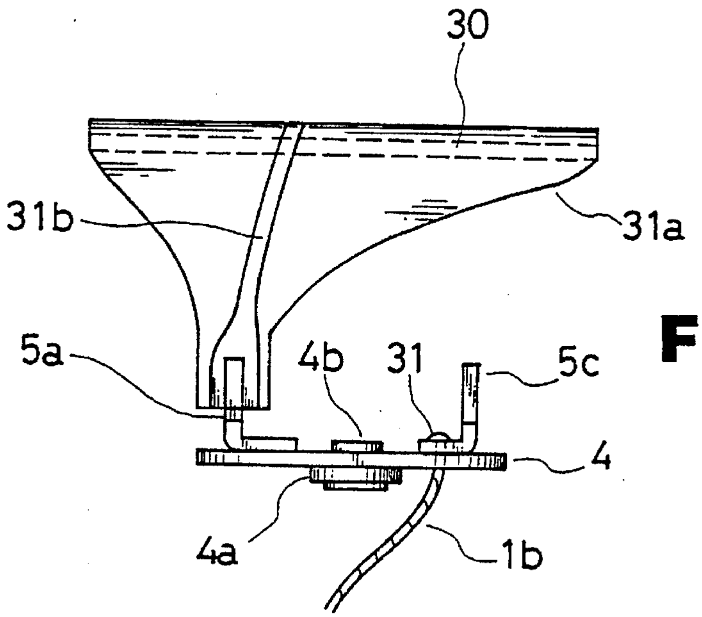
FIG. 6
FIG. 7
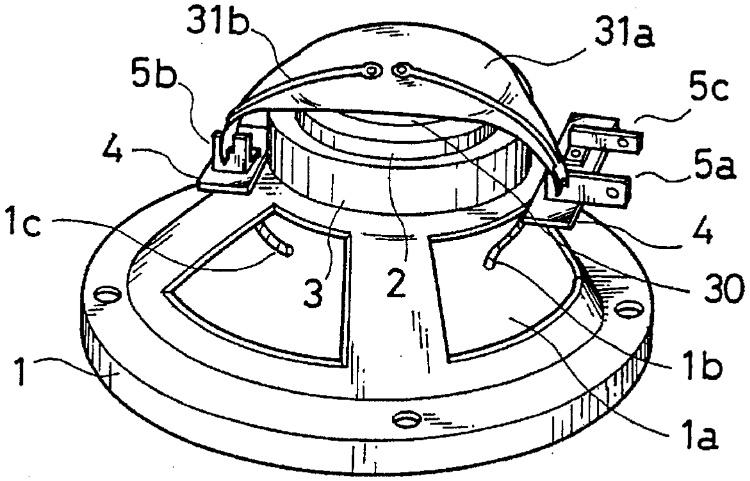
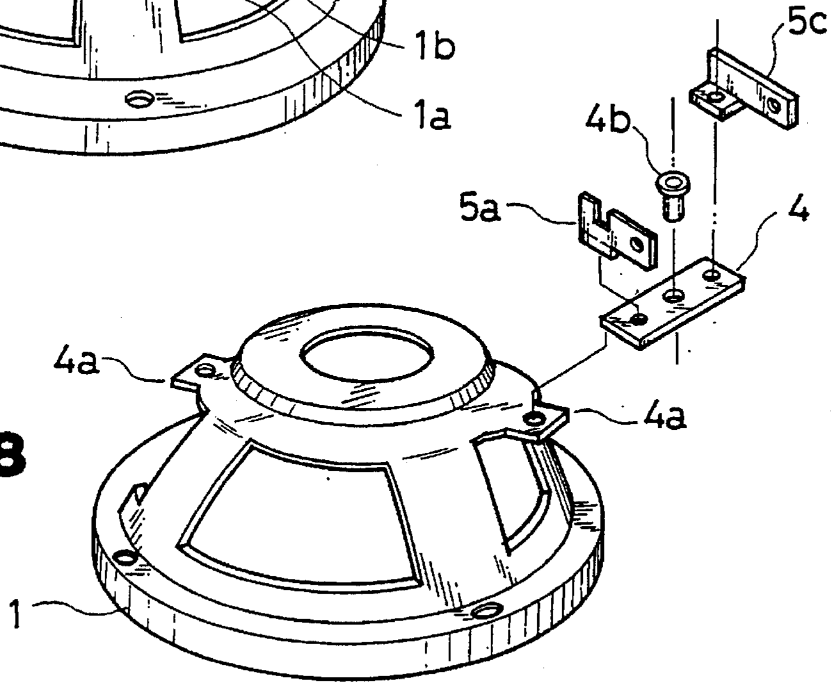
FIG. 8

SPEAKER DEVICE

BACKGROUND OF THE INVENTION

1. Field of the Invention

The present invention relates to a speaker device equipped with a crossover network (hereinafter referred to simply as "network") mainly for use in a sound reproducing system on an automobile.

2. Description of the Prior Art

FIG. 2 is a view showing an appearance of a conventional vehicular speaker unit equipped with a network which is disclosed, for example, in Japanese Patent Laid-Open No. 217792/85. FIG. 3 is a view showing the construction of the network portion in the speaker unit illustrated in FIG. 2. Further, FIG. 1 is a circuit diagram showing an example of combination of the speaker unit (tweeter unit) illustrated in FIGS. 2 and 3 with a woofer unit.

In FIG. 1, a capacitor, which corresponds to a capacitor 12*b* as will be described later, is inserted in series into the tweeter unit to constitute a high-pass filter. An attenuation characteristic of this high-pass filter corresponds to 6 dB/oct, and the capacitance of the capacitor is determined unconditionally by the frequency to be cut off on the basis of the said attenuation characteristic. Generally, a network in a speaker indicates such high-pass filter or a low-pass filter, or a combination thereof. A tweeter unit having a capacitor inserted in series into this circuit is connected in parallel with a woofer unit, and both constitute a speaker system called a two-way speaker system. Many of conventional vehicular speaker systems are relatively simple in structure like the construction of this example.

In FIG. 2, the reference numeral 1 denotes a frame of the speaker unit; numeral 2 denotes a pole piece; numeral 3 denotes a magnet; numeral 4 denotes a terminal strip; numeral 5 a terminal caulked to the terminal strip; numeral 7 a mounting hole formed in the frame 1; numeral 10 a lead wire soldered to the terminal 5; numeral 12 a network unit connected to the lead wire 10; and numeral 11 denotes a lead wire connected between the network unit 12 and a connector unit 13.

In FIG. 3, which illustrates the construction of components of the network unit 12, the numeral 12*a* denotes a printed circuit board; numeral 12*b* denotes a capacitor for the network; and numerals 12*c* and 12*d* represent electrode patterns formed on the surface of the printed circuit board 12*a*. The capacitor 12*b* is connected by soldering between the electrode patterns 12*c* and 12*d*. Further, the lead wires 10 and 11 are soldered to the corresponding electrode patterns respectively.

In FIG. 3, moreover, the numeral 12*e* denotes a connector for applying an audio input signal to the speaker unit, which connector is connected to the lead wire 11. A signal harness on the vehicle side is connected to the connector 12*e*. Numeral 12*f* denotes a heat-shrinkable tube. After the capacitor 12*b* has been soldered to the printed circuit board 12*a* and subsequently the lead wires 10 and 11 have been soldered to predetermined electrode patterns on the board 12*a*, the heat-shrinkable tube 12*f* is used for insulating and fixing all of those components. Numeral 12*g* denotes a cushion formed of a sheet-like resin foam or the like, which encloses the whole of the network unit in a roll shape.

The cushion 12*g* is used for preventing a hard component (e.g. printed circuit board 12*a*) of the network unit 12 from moving, causing collision and making an abnormal noise in the interior of the vehicle during vehicular running. For the same reason, the connector unit 13 is also covered with a cushion material.

The operation of the above conventional speaker unit will be described below.

According to the speaker unit shown in FIG. 2, a high frequency range is reproduced without distortion, and a combination thereof with a woofer unit permits reproduction of high fidelity. More particularly, as to the quality of reproduced sound in a vehicle, there now exists a demand for reproduction of a higher fidelity. For example, a so-called full range type speaker unit which, as a single speaker unit, intends to reproduce the whole range from low to high frequency range has heretofore been used in many cases. According to such a full range type speaker unit, however, a limit is encountered in point of reproduction frequency range and lowering of distortion. On the other hand, according to the speaker unit equipped with a network described above, a multi-channel reproduction can be effected by combining plural speaker units in accordance with reproduction bands and thus a high fidelity reproduction can be realized.

The following description is now provided about a method for mounting the above speaker unit.

FIG. 4 shows an example of a method for mounting the above speaker unit to a vehicle. In the same figure, the numeral 20 denotes an instrument panel of the vehicle; numeral 21 denotes a receptacle space for the speaker unit; numeral 22 denotes a connector; and numeral 23 denotes a signal harness connected to the connector 22. The signal harness 23 extends from an output end of a power amplifier on the vehicular side into the receptacle space 21, in which it shows up. By coupling the connector 22 with the connector 13 of the speaker unit it is made possible to perform sound reproduction. Numeral 24 denotes a bolt for clamping and fixing the speaker unit to the vehicle, and numeral 25 denotes a front glass.

The speaker unit is mounted to the vehicle by first coupling the connector unit 13 with the vehicle-side connector 22, then allowing the entire frame to fall into the receptacle space 21 and thereafter tightening and fixing the bolts 24 to the instrument panel 20 through the mounting holes 7 formed in the frame 1.

Since the conventional speaker unit is constructed as above, there have been the following various problems.

Firstly, it is difficult to install the speaker unit in an optimum place and this has been an obstacle to the reduction of the vehicular manufacturing cost or free design of a vehicle.

In more particular terms, whether the assembling time in the automobile manufacturing process is long or short exerts a great influence on the vehicular manufacturing cost, and hence how to shorten such assembling time has been an important subject. In the case of the conventional vehicular speaker unit equipped with a network and constructed as above, if its external size is large, it is difficult to accommodate the speaker unit into the receptacle space formed on the vehicular side, or even if the receptacle space is capable of receiving the speaker unit therein, the time required for mounting the speaker unit accurately therein may be increased.

This is because there is an optimum installation place which depends on the reproduction frequency of the speaker unit; in other words, it is not that the speaker unit may be installed anywhere in the vehicle. Particularly, a high-pitched sound is sharp in directivity and the attenuation value thereof based on reflection is large, as compared with a low-pitched sound. In a tweeter unit, therefore, it is preferred that the radiation axis of acoustic wave radiated from the tweeter unit be directed to both ears of the driver. For this reason, the tweeter unit is installed on the instrument panel 20 in many cases as shown in FIG. 4.

In the foregoing conventional speaker unit mounted on the instrument panel 20, the lead wires 10, 11, network unit 12 and connector unit 13, which are connected thereto, are bulky and the front glass 25 is an obstacle to widening of the space. Thus, since the installation place is a narrow space difficult to be visually checked, it is difficult to arrange those components in order and such circumstances sometimes cause an obstacle to placing and fixing the speaker unit in a predetermined position.

For example, in the network unit 12, in addition to the size of the printed circuit board 12*a*, since a non-polarized electrolytic capacitor is usually employed as the capacitor 12*b*, its external form is bulky. Besides, the printed circuit board with the components thereon is covered with the heat-shrinkable tube 12*f* which serves as both an insulator and a protector, and the outer periphery of the tube 12*f* is covered with the cushion 12*g* made of a soft foamed material, so that the entire external size becomes large inevitably.

When the speaker unit is accommodated in the receptacle space 21 of the instrument panel 20, the components may be buried beneath the pole piece 2 or protrude from the outer peripheral portion of the receptacle space 21, thus making the mounting operation difficult. Further, the components thus covered with the cushion member 12*g* are bulky and they have been a burden to a rational manufacture of vehicle because two speaker units are generally necessary for stereophonic reproduction.

Consequently, the receptacle space 21 on the vehicle side gives rise to an obstacle which is unignorable in attaining the reduction of the vehicular size. This is because the interior of the vehicular instrument panel 20 is a portion in which are concentrated control devices required for vehicular running as well as indicating instruments essential for vehicular running and typified by speedometer, tachometer and fuel gauge. That is, it has not always been easy to ensure a space for a sound reproducing apparatus having no direct bearing on the vehicular running. Thus, as to the installation place for the tweeter unit, there is antinomy, and how to solve it has been a problem in vehicular design.

Secondly, since the strength of the connecting portion of the network unit 12 is low, disconnection is apt to occur under the action of an external force or the like.

More particularly, the network unit 12 is disposed in a suitable position of the electrical line necessary for transmitting a signal to the speaker unit, but according to the method commonly adopted, as mentioned previously, the capacitor 12*b* is soldered onto electrode patterns on the printed circuit board 12*a*, and lead wires are soldered to the printed circuit board, so thus-soldered portions are low in mechanical strength, and the lead wires 10 and 11 are apt to break when an external force such as tension, torsion or bend exceeds a certain limit. Heretofore, such accident of disconnection has occurred most frequently at the time of mounting the speaker unit to a vehicle in the manufacturing process and also due to vibration or impact during vehicular running.

Thirdly, the manufacturing cost of the conventional speaker unit is high and this point has also been an obstacle to the reduction of the vehicular cost.

More particularly, the cost of covering the network unit 12 and the connector unit 13 with the cushion member 12*g* and that of connecting them with electric wires are also unignorable factors in addition to the manufacturing cost of the speaker unit itself. For example, the cost required for soldering the capacitor 12*b* to the printed circuit board 12*a* can be kept relatively low by using an automated manufacturing equipment such as an automatic soldering apparatus, but covering the printed circuit board 12*a* with capacitor with the cushion member 12*g* requires manual operation except the case where the production volume is very large. This has been a cause of raising the manufacturing cost.

The reason why manual operation is often adopted is that the external form is not regular so is difficult to be compatible with an automatic machine. In addition, there has been a contradiction such after the printed circuit board has been covered with the cushion member 12*g*, it is difficult to solder lead wires thereto, while after soldering of leads wires, the printed circuit board is difficult to be compatible with the automatic machine. That is, the problem is that it is impossible to find out an assembling sequence most suitable for the manufacture using an automatic machine. This is a main reason why it has been necessary to adopt a manual assembling work. Besides, it is necessary that the network unit 12 be covered with the heat-shrinkable tube 12*f* prior to being covered with the cushion member 12*g*. This has also been a cause of the necessity for adopting manual operation, for the same reason as above.

As an example of a technical literature associated with the prior art there is mentioned Japanese Utility Model Laid-Open No. 4089/85.

SUMMARY OF THE INVENTION

In view of the foregoing, it is an object of the present invention to provide a speaker device free of bulkiness caused by an external form of a network unit, capable of being mounted in a short time to a vehicle or the like in the manufacturing process thereof, scarcely undergoing such a trouble as disconnection, easy to be manufactured and inexpensive.

According to the first aspect of the present invention, for achieving the above-mentioned object, there is provided a speaker device for mainly reproducing only a high or low frequency range of an audio signal in which a capacitor for a crossover network is accommodated within a hole formed in a pole piece.

In the speaker device according to the first aspect of the present invention, as stated above, since a capacitor for use in a network unit is accommodated within the pole piece of the speaker unit itself, there is no likelihood of the capacitor being exposed to the exterior as a bulky obstacle, and thus the speaker device can be mounted more easily to a vehicular instrument panel for example.

According to the second aspect of the present invention there is provided a speaker device wherein a printed circuit board having an electrically conductive pattern serving as a part of an input signal line is disposed on an end face of a pole piece and an electrical connection of the foregoing capacitor to the said input signal line is formed on the conductive pattern of the printed circuit board.

In the speaker device according to the second aspect of the present invention, as stated above, since the electrical connection of the capacitor lies on the conductive pattern of the printed circuit board disposed on an end face of the pole piece, an external force is not directly exerted on the network unit, so there is no fear of occurrence of such a trouble as disconnection and hence there is obtained a highly reliable speaker system with network.

According to the third aspect of the present invention, there is provided a speaker device wherein a protective cover having an electrically conductive pattern serving as a part of the foregoing input signal line is disposed so as to cover an end portion of the foregoing pole piece, and an electrical connection of the foregoing capacitor to the input signal line is formed on the conductive pattern of the protective cover.

In the speaker system according to the third aspect of the present invention, as stated above, since the electrical connection of the capacitor lies on the conductive pattern of the protective cover which covers an end portion of the pole piece, an external force is not directly applied to the network unit, so a trouble such as disconnection will not occur and hence there is obtained a highly reliable speaker system with network.

According to the fourth aspect of the present invention, there is provided a speaker device for mainly reproducing only a high or low frequency range of an audio signal, wherein a printed circuit board having an electrically conductive pattern serving as a part of an input signal line is disposed on an end face of a pole piece, the foregoing capacitor is surface-mounted on the said printed circuit board, and an electrical connection of the capacitor to the input signal line is formed on the conductive pattern of the printed circuit board.

In the speaker device according to the fourth aspect of the present invention, as stated above, since the printed circuit board is disposed on an end face of the pole piece and the capacitor for a crossover network is surface-mounted on the printed circuit board, the capacitor can be disposed substantially in a planar form and a strong connection can be attained. Consequently, the size of the speaker unit can be further reduced and the reliability is improved to a greater extent.

According to the fifth aspect of the present invention, there is provided a speaker device wherein the shape of the aforesaid printed circuit board is the same as that of the foregoing protective cover covering an end portion of the pole piece, the foregoing conductive pattern is formed on an inner surface of the printed circuit board, and the foregoing capacitor is surface-mounted on the inner surface of the same board.

In the speaker device according to the fifth aspect of the present invention, as stated above, since the printed circuit board has the same shape as that of the protective cover which covers an end portion of the pole piece and the capacitor is surface-mounted with respect to the conductive pattern formed on the inner surface of the printed circuit board, the size of the speaker unit can be reduced and the printed circuit board is allowed to function as a protective cover for the speaker unit, thus permitting a common use of a component.

According to the sixth aspect of the present invention, there is provided a speaker device wherein the aforesaid protective cover or printed circuit board is formed using a high-permeable magnetic material.

In the speaker device according to the sixth aspect of the present invention, as stated above, since the protective cover or the printed circuit board is formed using a high-permeable magnetic material, there is obtained a network which also exhibits a magnetic shield effect.

According to the seventh aspect of the present invention, there is provided a speaker device for mainly reproducing only a high or low frequency range, wherein a terminal strip having an electrically conductive pattern serving as a part of an input signal line is fixed to a frame, a chip-like capacitor is surface-mounted on a planar portion of the terminal strip, and an electrical connection of the capacitor to the input signal line is formed on the conductive pattern of the terminal strip.

In the speaker device according to the seventh aspect of the present invention, as stated above, since the capacitor for a crossover network is formed in the shape of a chip and surface-mounted on a planar portion of the terminal strip fixed to the frame, it is possible to dispose the capacitor substantially in a planar form and a strong connection can be attained.

According to the eighth aspect of the present invention, there is provided a speaker device for mainly reproducing only a high or low frequency range of an audio signal, wherein an electrically conductive pattern serving as a part of an input signal line is formed on a frame, a chip-like capacitor is surface-mounted on the frame, and an electrical connection of the capacitor to the input signal line is formed on the conductive pattern of the frame.

In the speaker device according to the eighth aspect of the present invention, as stated above, since the capacitor for a crossover network is formed in the shape of a chip and surface-mounted on the speaker frame, it is possible to dispose the capacitor substantially in a planar form and a strong connection can be attained.

According to the ninth aspect of the present invention, there is provided a speaker device wherein a hole for receiving the aforesaid capacitor therein is formed on a central axis of a pole piece.

In the speaker device according to the ninth aspect of the present invention, as stated above, since a hole for accommodating the capacitor therein is formed on a central axis of a pole piece, the magnetic field for driving a diaphragm is little affected and hence the performance as the speaker is maintained high. (This is because a magnetic flux passes the surface portion of the pole piece concentratively.)

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIG. 1 is a circuit diagram showing an example of combination of a tweeter unit provided with a crossover network and a woofer unit;

FIG. 2 is a view showing an appearance of a conventional vehicular speaker unit with network;

FIG. 3 is a view showing a construction of a network portion as a constituent of the conventional speaker unit;

FIG. 6 is a partial detailed view showing a method for connecting a terminal and a flexible printed circuit board with each other in the speaker device embodying the present invention in the first, second or ninth aspect thereof;

FIG. 7 is a perspective view of the speaker device embodying the present invention in the first, second or ninth aspect thereof;

FIG. 8 is a partial detailed view showing a structure of a frame and that of a terminal strip in the speaker device embodying the present invention in the first, second or ninth aspect thereof;

DETAILED DESCRIPTION OF THE PREFERRED EMBODIMENTS

Preferred embodiments of the present invention will be described in detail hereinunder with reference to the accompanying drawings.

Embodiment 1

Embodiment 1 of the present invention in the first, second or ninth aspect of the invention will now be described referring to FIGS. 5 to 9.

Figure 4:
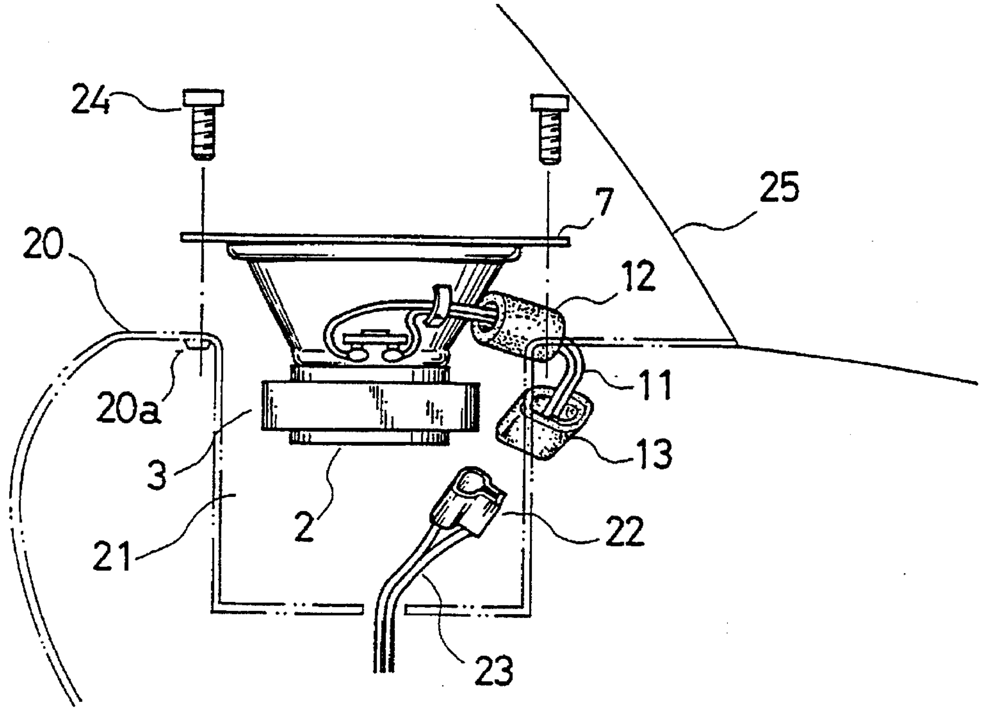
FIG. 4 (PRIOR ART)
FIG. 4 is a view showing an example of a mounted state of the conventional speaker unit to a vehicle.
Figure 5:
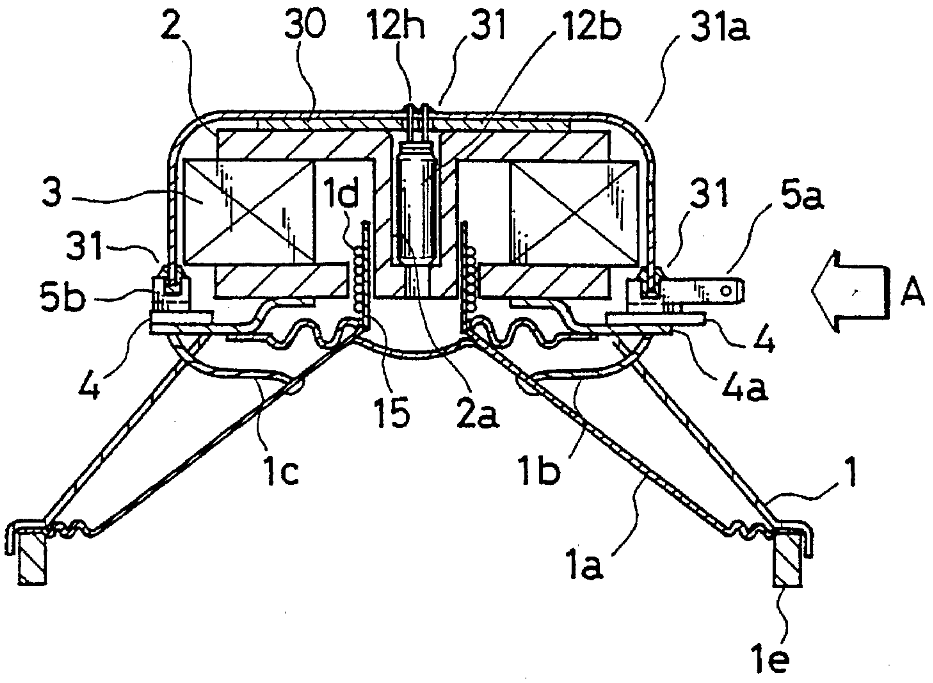
FIG. 5 is a sectional side view of a speaker device embodying the present invention in the first, second or ninth aspect of the invention.
Figure 9:
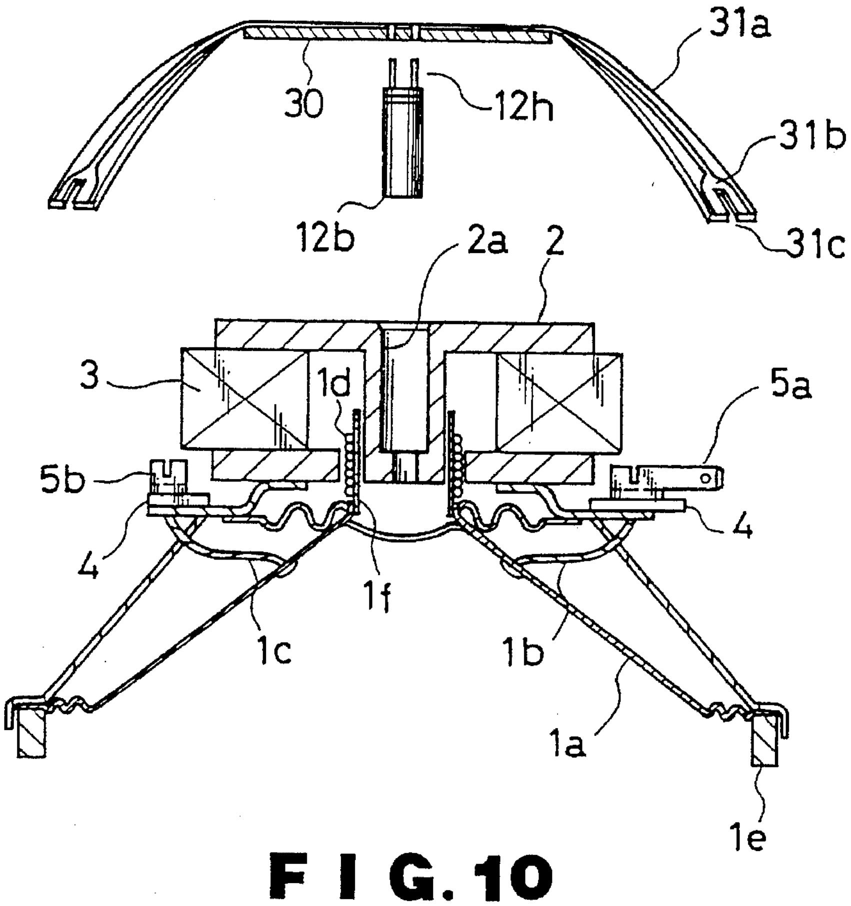
FIG. 9 is a sectional side view showing an extracted state of network components in the speaker device embodying the present invention in the first, second or ninth aspect thereof.

FIG. 5 is a sectional side view of a speaker device according to embodiment 1, FIG. 6 is a partial detail view of a portion as seen in the direction of arrow A in FIG. 5 (particularly showing a method for connecting terminals with a network), FIG. 8 is a partial detailed view of FIG. 7 (particularly showing a method for assembling a frame 1 and a terminal strip 4), and FIG. 9 is a sectional side view showing an extracted state of network components used in the speaker device (particularly showing a terminal shape of the flexible printed circuit board). The same components as in the foregoing prior art illustrated in FIG. 2, etc. are indicated by the same reference numerals as in the prior art to omit repeated explanation thereof.

In FIGS. 5 to 7, the numeral 1*a* denotes a diaphragm; numeral 1*d* denotes a voice coil wound spirally on the surface of a cylindrical bobbin; numerals 1*b* and 1*c* represent cotton lines for connecting both a winding start end and a winding terminal end of the voice coil 1*d* to a terminal 5*c* or relay terminal 5*b* which will be described later; numeral 1*e* denotes a gasket; numeral 2*a* denotes a hole for receiving a capacitor 12*b* therein, which hole is formed on a central axis of a pole piece 2; numeral 4*a* denotes a terminal strip holder formed on both sides of a frame 1 and to which is fixed the terminal strip 4; numeral 4*b* denotes an eyelet for use in caulking and fixing the terminal strip 4 to the terminal strip holder 4*a*; numerals 5*a* and 5*c* represent terminals each caulked and fixed through eyelet 4*b* to the surface of one of the terminal strips 4 disposed on both sides of the frame 1; and numeral 5*b* denotes a relay terminal caulked and fixed also through eyelet 4*b* to the surface of the other terminal strip 4.

Numeral 12*h* denotes an electrode lead of the capacitor 12*b*; numeral 30 denotes a printed circuit board; numeral 31*a* denotes a flexible printed circuit board; the portions indicated by the reference numeral 31*b* represent electrically conductive patterns formed respectively on the flexible printed circuit board 31*a* so as to be connected to the electrode leads 12*h* and extend to both ends; numeral 31 denotes a solder which connects the electrode leads 12*h* to the conductive patterns 31*b*; and numeral 31*c* denotes a slit formed in both ends of the flexible printed circuit board 31*a*.

The printed circuit board 30 and the flexible printed circuit board 31*a* are bonded with each other through respective surfaces. In this case, the printed circuit board 30 merely functions as a reinforcing member for the flexible printed circuit board 31*a*. Each end portion of each conductive pattern 31*b* of the flexible printed circuit board 31*a* is connected to the relay terminal 5*b* or the terminal 5*a* by fitting the slit 31*c* on a vertical plate-like portion of the relay terminal 5*b* or the terminal 5*a*, followed by soldering. It is not always necessary to form the slit 31*c*. Whether the slit 31*c* is to be formed or not depends on how the soldering is performed.

The operation of this embodiment will now be described. In the speaker device constructed as above, by fitting the foregoing connector 22 on the terminals 5*a* and 5*c* and connecting a signal input harness 23 thereto, there is formed the network shown in FIG. 1 with the capacitor 12*b* inserted therein as a high-pass filter. Thus, the speaker device realizes a high fidelity reproduction as a tweeter in a multi-channel playback system.

In the speaker device of this embodiment, moreover, since the capacitor 12*b* is accommodated within the pole piece 2 of the speaker unit itself, there is no likelihood of the capacitor 12*b* from being exposed to the exterior as a bulky obstacle, thus permitting easy installation on the vehicular instrument panel or the like. Moreover, since the electrical connection of the capacitor 12*b* lies on the printed circuit boards 30, 31*a* disposed on an end face of the pole piece 2, an external force is not directly exerted on the electrode leads 12*h* of the capacitor. Consequently, there is no fear of occurrence of such troubles as disconnection and poor contact, whereby the reliability is improved.

Further, since in this embodiment the hole 2*a* for receiving the capacitor 12*b* therein is formed on the central axis of the pole piece 2, the above performance as a tweeter is maintained high. This is because a magnetic flux passes the surface portion of the pole piece 2 concentratively so exerts little influence on the magnetic field for driving the diaphragm 1*a* even if the hole 2*a* is formed.

Embodiment 2

Figure 10:
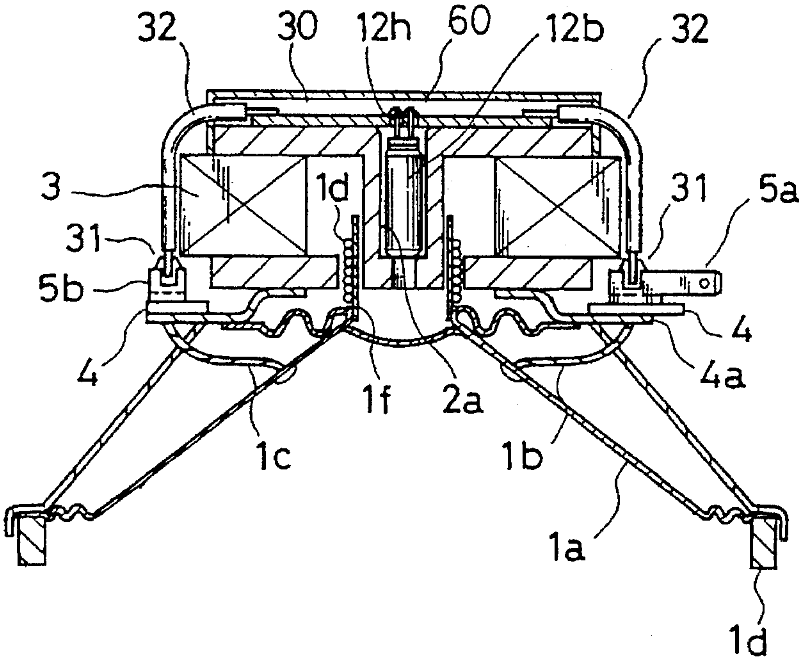
FIG. 10 is a sectional side view of a speaker device according to another embodiment of the present invention in the first, second or ninth aspect of the invention.

Another embodiment of the present invention in the first, second or ninth aspect thereof will now be described with reference to FIG. 10. FIG. 10 is a sectional side view of a speaker device of this embodiment. In the same figure, the numeral 30 denotes a printed circuit board; numeral 32 denotes a polyvinyl chloride wire; and numeral 60 denotes a protective cover. One end of each polyvinyl chloride wire 32 is connected by soldering to an electrically conductive pattern (not shown) formed on the surface of the printed circuit board 30, while an opposite end thereof is connected to the terminal *5a* or *5b* of the speaker unit also by soldering. The protective cover 60 is for insulating and protecting the electrode pattern surfaces of the printed circuit board 30 and the electrode leads 12*h* of the capacitor 12*b* which are soldered to the electrode patterns.

The operation of this embodiment will now be described. Also according to the speaker device of this embodiment, like embodiment 1, a high fidelity reproduction is realized as a tweeter in a multi-channel playback system, and easy installation on a vehicular instrument panel or the like can be effected, or there is no fear of occurrence of such troubles as disconnection and poor contact, so that the reliability is improved.

Besides, there is attained a peculiar effect such that, for example, a short-circuit accident with other components in a vehicle or the like is prevented by the protective cover 60. Further, since a conductive pattern on the printed circuit board 30 and the terminal *5a* or *5b* are connected with each other through the polyvinyl chloride wire 32 which is relatively high in strength and used commonly, a high strength is ensured against disconnection or the like in this portion. It goes without saying that the thickness of the protective cover 60 can be made smaller by using such a flexible printed circuit board as shown embodiment 1 in place of the polyvinyl chloride wire 32.

Embodiment 3

Figure 11:
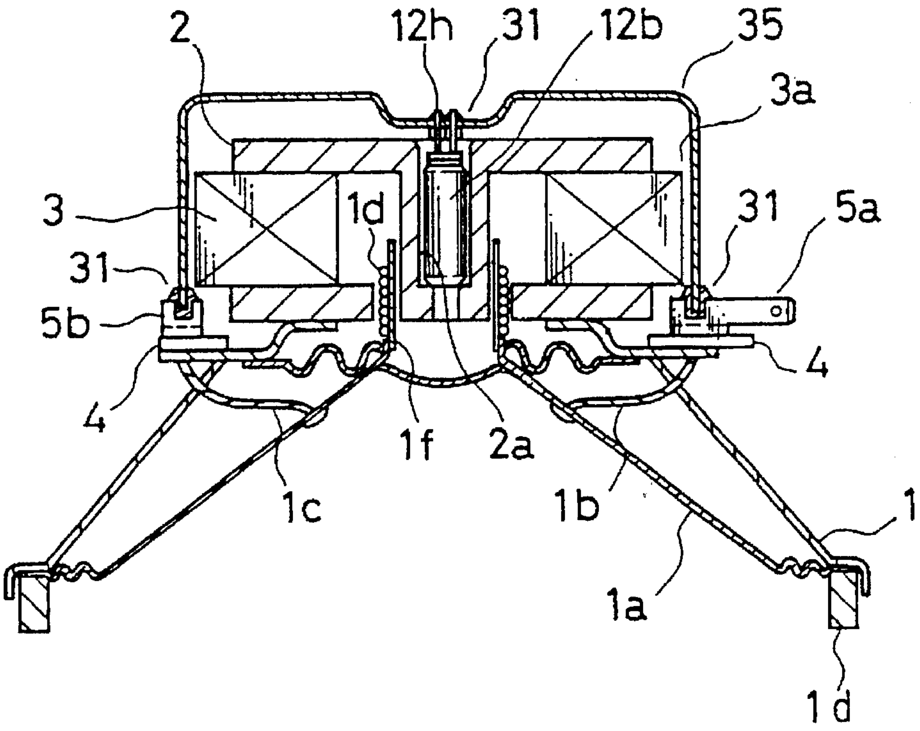
FIG. 11 is a sectional side view of a speaker device embodying the present invention in the third aspect of the invention.
Figure 12:
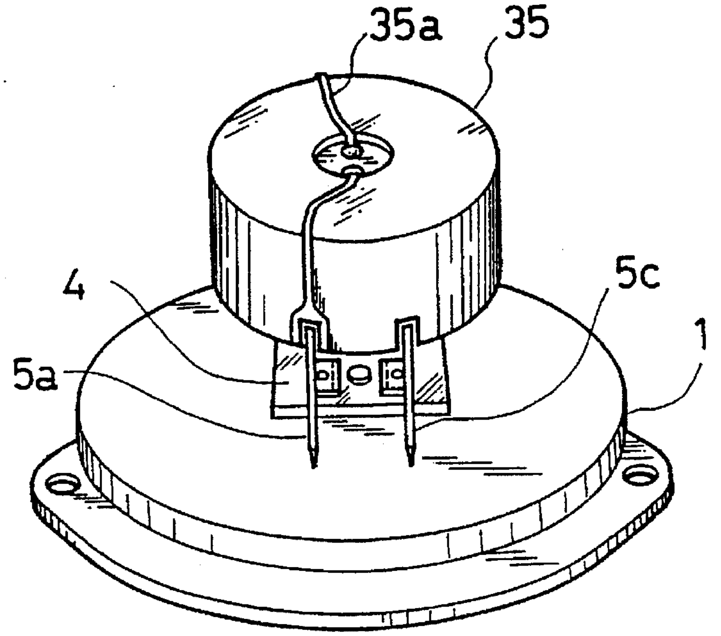
FIG. 12 is a perspective view of the speaker device embodying the present invention in the third aspect thereof.

The following description is now provided about an embodiment of the present invention in the third aspect thereof with reference to FIGS. 11 and 12. FIG. 11 is a sectional side view of a speaker device of this embodiment and FIG. 12 is a perspective view thereof. In these figures, the numeral 35 denotes a protective cover made of a plastic material, with two conductive patterns 35*a* formed on the surface thereof. The protective cover 35 is sized and shaped so as to cover a pole piece 2 and a magnet 3, and has a long vertical portion.

The conductive patterns 35 are highly conductive films formed on the surface of the plastic protective cover 35 by a suitable treatment such as, for example, chemical plating, spray coating or sputtering. Electrodes 12*h* of a capacitor 12*b* are soldered to the conductive patterns 35*a*. The construction wherein the capacitor 12*b* is inserted into a hole formed on the central axis of the pole piece 2, and the construction wherein the two conductive patterns 35*a* are connected to terminals *5a* and *5b* through slits formed in end portions of the patterns, are the same as in embodiment 1.

The operation of this embodiment will now be described. Also in the speaker device of this embodiment, like embodiment 1, a high fidelity reproduction is realized as a tweeter in a multi-channel playback system, and easy installation on a vehicular instrument panel or the like is attained, or there is no fear of occurrence of such troubles as disconnection and poor contact, whereby the reliability is improved. Particularly, in the case of this embodiment, since there is not used any rigidity-free electric wire, including the flexible printed circuit board, an extremely high strength against disconnection or the like is ensured.

Besides, there is obtained a peculiar effect such that dangerous corners of the magnet 3 are not exposed due to the presence of the protective cover 35 and therefore it is possible to prevent the workers etc. from being injured. In more particular terms, since the magnet 3 is usually fabricated by cutting a ceramic material in round slices like sliced pineapple, its corner portions are very sharp, so when the speaker unit is mounted to a vehicular rear shelf for example, the corners of the magnet 3 project to the interior of the trunk. Therefore, it is possible that the assembly worker or the vehicle user who puts his hands into the trunk will be injured. According to this embodiment, however, such possibility is eliminated.

Embodiment 4

Figure 13:
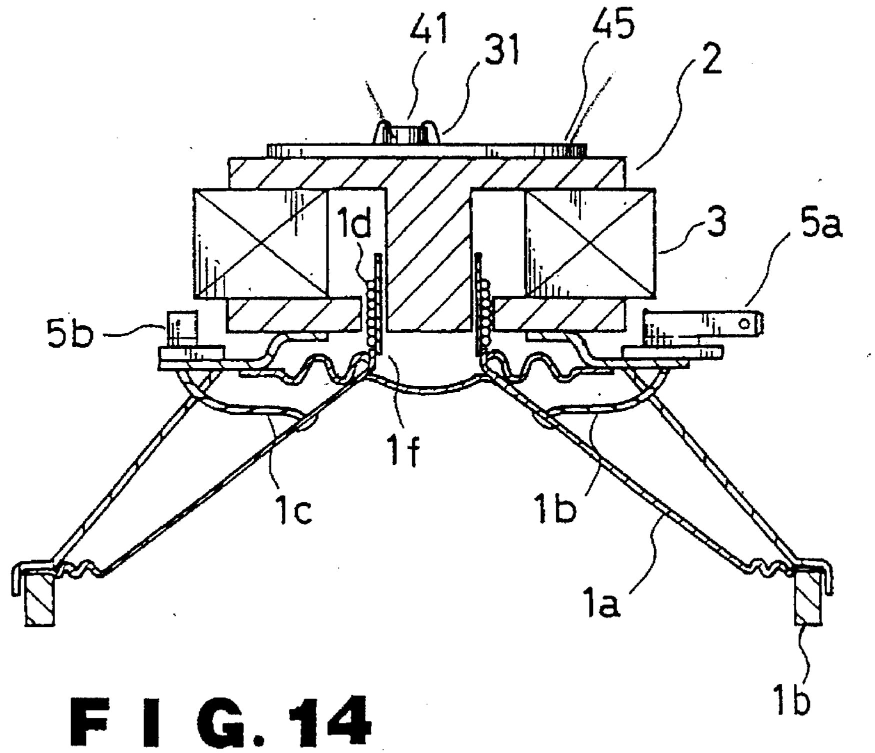
FIG. 13 is a sectional side view of a speaker device embodying the present invention in the fourth aspect of the invention.
Figure 14:
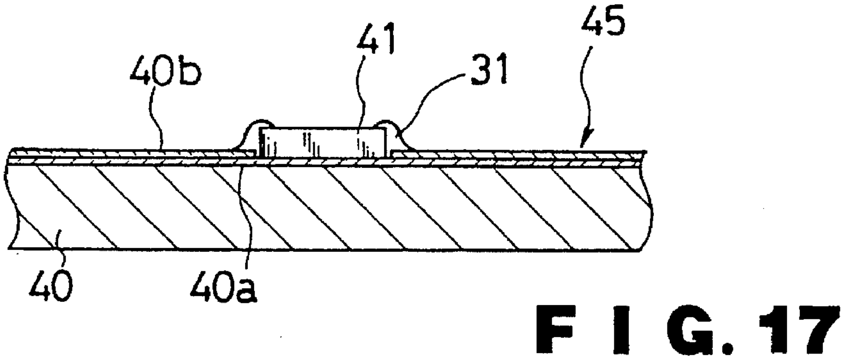
FIG. 14 is a sectional side view showing a printed circuit board mounting portion in the speaker device embodying the present invention in the fourth aspect thereof.

An embodiment of the present invention in the fourth aspect thereof will now be described with reference to FIGS. 13 and 14. FIG. 13 is a sectional side view of a speaker device according to this embodiment, and FIG. 14 is a sectional side view showing a mounting portion of a printed circuit board. In these figures, the numeral 45 denotes a printed circuit board disposed on an end face of a pole piece 2; numeral 40 denotes a base of the printed circuit board; numeral 40*a* denotes an insulating layer; numeral 40*b* denotes a conductive pattern; and numeral 41 denotes a chip-like capacitor mounted on the printed circuit board 45.

As the material of the base 40, not only an insulating material such as, for example, epoxy or phenolic material but also an electrically conductive material such as, for example, aluminum or iron plate is employable. In this embodiment, the base 40 is formed using an electrically conductive material. The insulating layer 40*a* is formed on the surface of the base 40 by such means as coating or baking, and the conductive pattern 40*b* is formed on the surface of the insulating layer 40*a* by such means as etching. The capacitor 41 is a microelectronic component called a chip part and it is connected onto the conductive pattern 40*b* by soldering as indicated at 31. Further, the printed circuit board 45 is mounted onto an end face of the pole piece 2 by such means as bonding. Connection from the printed circuit board 45 to terminals *5a* and *5b* is the same as in embodiment 1 or 2, so illustration or explanation thereof is omitted.

The operation of this embodiment will now be described. According to the speaker device of this embodiment, like embodiment 1, not only a high fidelity reproduction is realized as a tweeter in a multi-channel playback system but also easy installation on a vehicular instrument panel or the like is attained and there is no fear of occurrence of such troubles as disconnection and poor contact, whereby the reliability is improved.

In addition, since the speaker device of this embodiment uses a microchip-like capacitor 41, though a hole is not formed in the pole piece 2, the portion which constitutes the network becomes smaller in size and a small size is maintained even after mounting of the capacitor onto the printed circuit board 45 is maintained, whereby the above-mentioned effect of easy installation is ensured. Consequently, the labor and cost for machining a hole in the pole piece 2 are saved. Moreover, in the case where the capacitance of the capacitor is not sufficient, the capacitance can be adjusted by mounting and connecting a plurality of such chip-like capacitors in parallel. Thus, the degree of freedom in design is improved, which is a unique effect.

Embodiment 5

Figure 15:
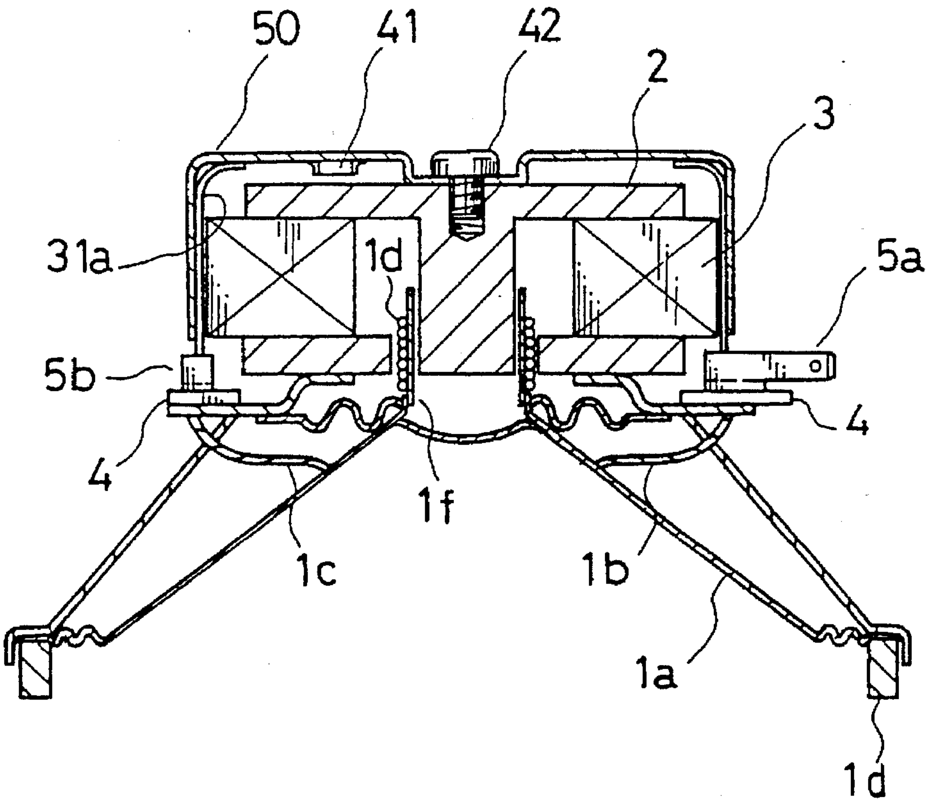
FIG. 15 is a sectional side view of a speaker device embodying the present invention in the fifth or sixth aspect of the invention.
Figure 16:
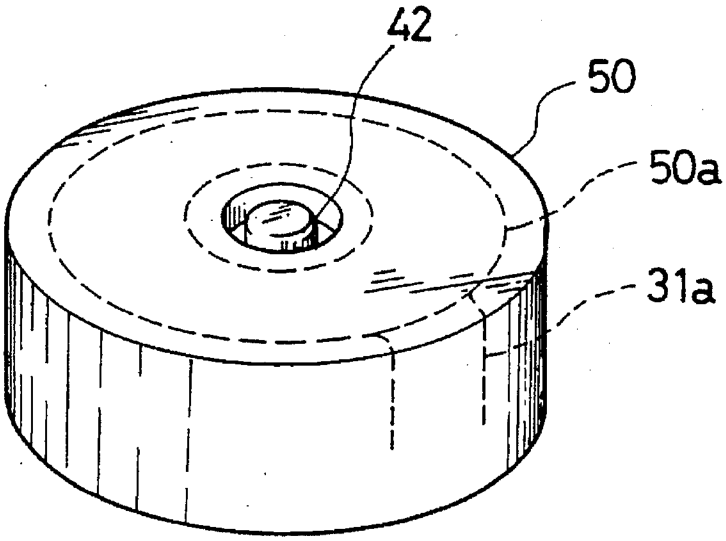
FIG. 16 is a perspective view of a printed circuit board used in the speaker device embodying the present invention in the fifth or sixth aspect thereof.

Now, an embodiment of the present invention in the fifth or sixth aspect thereof will be described with reference to FIGS. 15 and 16. FIG. 15 is a sectional side view of a speaker device according to this embodiment, and FIG. 16 is a perspective view of a printed circuit board used therein. In these figures, the numeral 50 denotes a printed circuit board having a base formed of a ferromagnetic material like an iron plate and which is in the form of a protective cover covering a magnet 3 and a pole piece 2. Numeral 42 denotes a bolt for fixing the printed circuit board 50 to an end face of the pole piece 2.

The printed circuit board 50 has a laminate structure similar to that of the printed circuit board 45 used in embodiment 4, but a conductive pattern 50*b* corresponding to the conductive pattern 40*b* is formed on an inner end face of the board so as to keep away from the bolt 42, as shown in FIG. 16. The conductive pattern 50*b* of the printed circuit board 50 is connected to terminals 5*a* and 5*b* through flexible printed circuit boards 31*a* disposed at both side positions along the inner side face of the board 50. A capacitor 41 is mounted on the inner surface of the printed circuit board 50 and is connected to the terminals 5*a* and 5*b* through the conductive pattern 50*b* and flexible printed circuit boards 31*a*.

The operation of this embodiment will now be described. According to the speaker device of this embodiment, like embodiment 1, not only a high fidelity reproduction is realized as a tweeter in a multi-channel playback system but also easy installation on a vehicular instrument panel or the like is attained and there is no fear of occurrence of such troubles as disconnection and poor contact, thus affording the effect of improved reliability.

Besides, since the printed circuit board 50 with the capacitor 41 mounted inside also functions as a protective cover, the construction of the entire device can be simplified. Moreover, in the event the capacitance of the capacitor is not sufficient, it can be adjusted by mounting and connecting a plurality of chip-like capacitors in parallel. Thus, the degree of freedom in design is improved, which is a unique effect.

Further, since the base of the printed circuit board 50 is formed of a ferromagnetic material, flux leakage from the magnet 3 is prevented and consequently the speaker device can be made a flux leakage preventing type speaker device. As a result, it is possible to prevent flux leakage from the speaker device from exerting a bad influence on the CRT of a navigation system, etc. mounted on the vehicle and causing dislocation of color and also possible to prevent such flux leakage from being an obstacle to a geomagnetism sensor of the navigation system and causing an error in position information.

Embodiment 6

Figure 17:
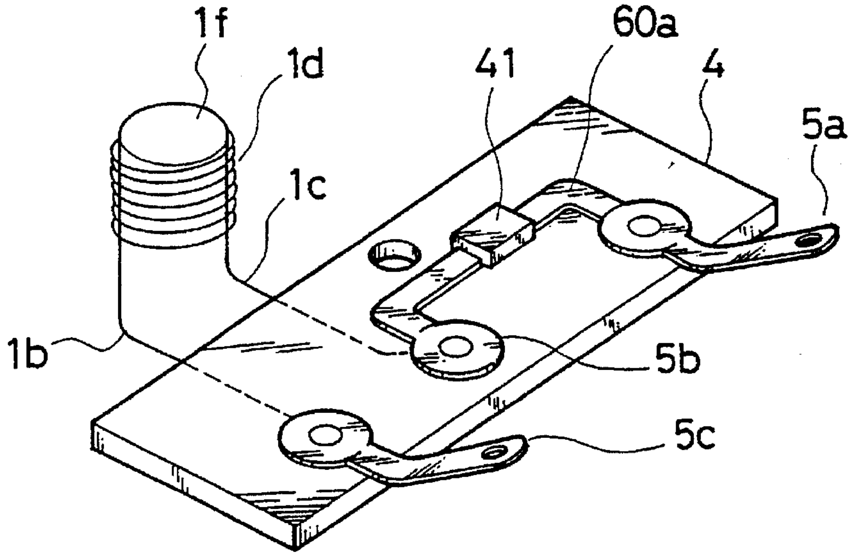
FIG. 17 is a view showing a construction of a terminal strip used in a speaker device embodying the present invention in the seventh aspect of the invention and also showing a connected state of the said terminal strip with a voice coil.

The following description is now provided about an embodiment of the present invention in the seventh aspect thereof with reference to FIG. 17. FIG. 17 illustrates the construction of a terminal strip 4 used in the speaker device of this embodiment and a connected state of the terminal strip 4 with a voice coil 1*d*. In this embodiment, only the terminal strip 4 with terminals 5*a* and 5*c* caulked and fixed thereto is provided on one side, and except the construction shown in FIG. 17, the construction of this embodiment is the same as in embodiment 1. The numeral 60*a* in FIG. 17 denotes a conductive pattern formed on the terminal strip 4.

One end side of the conductive pattern 60*a* is connected to the terminal 5*a*, while an opposite end side thereof forms a terminal 5*c* in a position between the terminals 5*a* and 5*c*. A chip-like capacitor 41 is mounted on the terminal strip 4 in a connected state to an intermediate part of the conductive pattern 60*a*. The terminals 5*b* and 5*c* are connected to the voice coil 1*d* through cotton lines 1*c* and 1*b*, respectively.

The operation of this embodiment will now be described. According to the speaker device of this embodiment, like embodiment 1, a high fidelity reproduction is realized as a tweeter in a multi-channel playback system; besides, easy installation on a vehicular instrument panel or the like is attained and there is no fear of occurrence of such troubles as disconnection and poor contact, whereby the reliability is improved.

It is not always necessary to dispose the chip-like capacitor 41 on an insulator. For example, it may be mounted on the frame 1 through a conductive pattern formed on the frame surface, whereby the same effects as above can be attained. More particularly, the network may be provided on the surface of any of the components of the speaker unit, and in the speaker unit thus constructed it is possible to expect the reduction of size, a high reliability and a good mounting property to a vehicle.

As set forth above, according to the construction in the first aspect of the present invention, since the capacitor for a network is accommodated within the pole piece of the speaker unit itself, there is no likelihood of the capacitor being exposed to the exterior as a bulky obstacle and hence there is attained easy installation on a vehicular instrument panel or the like, thus contributing to the improvement of productivity in the automobile manufacturing process, etc.

According to the construction in the second aspect of the present invention, since the electrical connection of the capacitor lies on the conductive patterns of the printed circuit board disposed on an end face of the pole piece, an external force is not directly applied to the network unit, so a trouble such as disconnection will not occur and hence there is obtained a highly reliable speaker system with network.

According to the construction in the third aspect of the present invention, since the electrical connection of the capacitor lies on the conductive patterns formed on the protective cover which covers an end face of the pole piece, an external force is not directly applied to the network unit, so a trouble such as disconnection will not occur and hence there is obtained a highly reliable speaker system with network.

According to the construction in the fourth aspect of the present invention, since a printed circuit board is provided on an end face of the pole piece and a capacitor for a crossover network is surface-mounted thereon, it is possible to dispose the capacitor substantially in a planar form and a strong connection can be effected. Further, the speaker unit can be made small in size and the reliability is improved.

According to the construction in the fifth aspect of the present invention, since the shape of the printed circuit board is like that of the protective cover which covers an end portion of the pole piece and the capacitor is surface-mounted on a conductive pattern formed on the inner surface of the printed circuit board, not only the size of the speaker unit can be reduced but also the printed circuit board is allowed to function as a protective cover, thus permitting a common use of components.

According to the construction in the sixth aspect of the present invention, since the protective cover or the printed circuit board is formed using a high-permeable magnetic material, a magnetic shield effect is exhibited and the fear of a bad influence being exerted on the other electric devices provided on the vehicle or the like can thereby be eliminated.

According to the construction in the seventh aspect of the present invention, since the capacitor for a crossover network is made chip-like and is surface-mounted on a plane portion of the terminal strip fixed to the frame, not only the capacitor can be disposed substantially in a planar form to attain the reduction of size but also it is possible to effect a strong connection.

According to the construction in the eighth aspect of the present invention, since the capacitor for a crossover network is made chip-like and is surface-mounted on the speaker frame, it is possible to dispose the capacitor substantially in a planar form, thereby attaining the reduction of size, and a strong connection can be attained.

According to the construction in the ninth aspect of the present invention, since a hole for receiving the capacitor therein is formed on the central axis of the pole piece, the performance as a speaker is maintained high with little influence exerted on the magnetic field for driving the diaphragm.

While preferred embodiments of the invention have been described using specific terms, such description is for illustrative purposes only, and it is to be understood that changes and variations may be made without departing from the spirit or scope of the following claims.

What is claimed is:

1. A speaker device comprising:

a pole piece having a magnet attached thereto;

a voice coil disposed so as to undergo a predetermined electromagnetic force in a magnetic field induced by said pole piece;

a diaphragm connected to said voice coil and adapted to oscillate together with the voice coil under the action of said electromagnetic force, thereby producing a sound;

a capacitor for a crossover network inserted to form a high-pass filter or a low-pass filter on an input signal line which inputs an audio signal to said voice coil; and a protective cover covering an end portion of said pole piece, said speaker device mainly reproducing only a high or low frequency range of said audio signal, wherein a printed circuit board having a shape similar to said protective cover and having a conductive pattern serving as a part of said input signal line formed on an inner surface thereof, is disposed on an end face of said pole piece, said capacitor is surface-mounted on the inner-surface of said printed circuit board, and an electrical connection of said capacitor to said input signal line is formed on the conductive pattern of said printed circuit board.

2. A speaker device comprising:

a pole piece having a magnet attached thereto;

a voice coil disposed so as to undergo a predetermined electromagnetic force in a magnetic field induced by said pole piece;

a diaphragm connected to said voice coil and adapted to oscillate together with the voice coil under the action of said electromagnetic force, thereby producing a sound; and a capacitor for a crossover network inserted to form a high-pass filter or a low-pass filter on an input signal line which inputs an audio signal to said voice coil, said speaker device mainly reproducing only a high or low frequency range of said audio signal, wherein said capacitor is accommodated within a hole formed in said pole piece.

3. A speaker device according to claim 2, wherein a printed circuit board having a conductive pattern serving as a part of said input signal line is disposed on an end face of said pole piece, and an electrical connection of said capacitor to the input signal line is formed on the conductive pattern of said printed circuit board.

4. A speaker device according to claim 2, wherein a protective cover having a conductive pattern serving as a part of said input signal line is disposed so as to cover an end portion of said pole piece, and an electrical connection of said capacitor to the input signal line is formed on a conductive pattern of said protective cover.

5. A speaker device according to claim 2, wherein said hole for accommodating said capacitor therein is formed on a central axis of said pole piece.

6. A speaker device according to claim 4 or claim 1, wherein said protective cover or said printed circuit board is formed using a high-permeable magnetic material.

* * * * *